US007778619B2

(12) United States Patent
Bultan et al.

(10) Patent No.: US 7,778,619 B2
(45) Date of Patent: *Aug. 17, 2010

(54) METHOD AND APPARATUS FOR AUTOMATIC FREQUENCY CORRECTION WITH A FREQUENCY ERROR SIGNAL GENERATED BY BLOCK CORRELATION OF BASEBAND SAMPLES WITH A KNOWN CODE SEQUENCE

(75) Inventors: Aykut Bultan, Bayside, NY (US); Donald M. Grieco, Manhasset, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/408,285

(22) Filed: Mar. 20, 2009

(65) Prior Publication Data

US 2009/0176459 A1 Jul. 9, 2009

Related U.S. Application Data

(63) Continuation of application No. 11/983,491, filed on Nov. 9, 2007, now Pat. No. 7,509,108, which is a continuation of application No. 11/382,380, filed on May 9, 2006, now Pat. No. 7,299,023, which is a continuation of application No. 10/977,053, filed on Oct. 29, 2004, now Pat. No. 7,058,378.

(60) Provisional application No. 60/523,051, filed on Nov. 18, 2003.

(51) Int. Cl.
*H04B 7/00* (2006.01)

(52) U.S. Cl. .................. 455/258; 455/255; 455/257; 375/341; 375/344

(58) Field of Classification Search ................. 455/424, 455/425, 456.5, 456.6, 561, 550.1, 575.1, 455/458, 258, 255, 265, 296, 63.1, 67.11, 455/75, 136, 173.1, 182.1, 182.2, 192.2, 455/208; 375/317, 148, 147, 142, 149, 130, 375/150, 344, 365, 376, 362; 370/342, 204, 370/324; 342/199, 189, 192, 194
See application file for complete search history.

(56) References Cited

U.S. PATENT DOCUMENTS

| | | | | |
|---|---|---|---|---|
| 5,579,338 | A | * 11/1996 | Kojima | ........................ 375/149 |
| 5,774,494 | A | 6/1998 | Sawahashi et al. | |
| 5,818,882 | A | * 10/1998 | Komatsu | ..................... 375/344 |
| 6,067,292 | A | * 5/2000 | Huang et al. | ................. 370/342 |
| 6,625,197 | B1 | * 9/2003 | Lundby et al. | ............... 375/130 |
| 6,728,326 | B1 | * 4/2004 | Fulghum | ..................... 375/365 |
| 6,934,245 | B2 | * 8/2005 | Kwak et al. | .................. 370/204 |
| 7,145,886 | B1 | 12/2006 | Kitade et al. | |
| 7,199,712 | B2 | * 4/2007 | Tafas et al. | ............... 340/572.1 |

(Continued)

*Primary Examiner*—Duc Nguyen
*Assistant Examiner*—Charles Chow
(74) *Attorney, Agent, or Firm*—Volpe and Koenig PC

(57) ABSTRACT

The present invention is related to a method and apparatus for automatic frequency correction of a local oscillator. The apparatus receives a carrier signal. The carrier signal includes a code sequence known to the apparatus. The apparatus downconverts the carrier signal to a baseband signal using the local oscillator. The apparatus performs a block correlation of the samples of the baseband signal with the known code sequence to generate a frequency error signal. The frequency error signal is fed back to the local oscillator to correct the frequency error.

15 Claims, 6 Drawing Sheets

U.S. PATENT DOCUMENTS

| | | | |
|---|---|---|---|
| 7,346,013 | B2 | 3/2008 | Garmany et al. |
| 7,509,108 | B2* | 3/2009 | Grieco et al. ............... 455/258 |
| 2001/0008838 | A1* | 7/2001 | Toskala et al. ............. 455/458 |
| 2002/0101845 | A1* | 8/2002 | Kim et al. .................. 370/342 |
| 2003/0081656 | A1* | 5/2003 | Buehrer et al. ............. 375/142 |
| 2003/0086482 | A1* | 5/2003 | Shimizu et al. ............. 375/147 |
| 2004/0057505 | A1* | 3/2004 | Valio .......................... 375/148 |
| 2004/0114551 | A1* | 6/2004 | Gavillero Martin et al. . 370/324 |
| 2004/0190603 | A1* | 9/2004 | Dabak et al. ................. 375/148 |
| 2005/0047484 | A1* | 3/2005 | He et al. ..................... 375/148 |
| 2005/0078771 | A1* | 4/2005 | Oh et al. ..................... 375/317 |
| 2007/0286263 | A1* | 12/2007 | Kwentus et al. ............. 375/150 |

* cited by examiner

METHOD AND APPARATUS FOR AUTOMATIC FREQUENCY CORRECTION WITH A FREQUENCY ERROR SIGNAL GENERATED BY BLOCK CORRELATION OF BASEBAND SAMPLES WITH A KNOWN CODE SEQUENCE

CROSS REFERENCE TO RELATED APPLICATIONS

This application is a continuation of U.S. application Ser. No. 11/983,491, filed Nov. 9, 2007, which is a continuation of U.S. application Ser. No. 11/382,380, filed May 9, 2006, which issued as U.S. Pat. No. 7,299,023 on Nov. 20, 2007, which is a continuation of U.S. application Ser. No. 10/977,053, filed Oct. 29, 2004, which issued as U.S. Pat. No. 7,058,378, on Jun. 6, 2006, which claims the benefit of U.S. provisional application no. 60/523,051 filed Nov. 18, 2003, which is incorporated by reference as if fully set forth.

FIELD OF INVENTION

The application is related to wireless communications. More particularly, the application is related to a method and apparatus for automatic frequency correction (AFC).

BACKGROUND

In a wireless communication system, a transmitter modulates a baseband signal with a high frequency carrier to transmit to a receiver. The modulated signal is received and demodulated at the receiver. For modulation and demodulation, both a transmitter and a receiver include a local oscillator for generating the same frequency carrier signal. To effectively demodulate the modulated signal, the frequency of the local oscillator at the receiver should be same as that of the transmitter. Therefore, it is important to remove phase errors between the transmitter and the receiver local oscillators.

Although the nominal frequencies of a wireless transmit/receive unit (WTRU) and a base station local oscillator are the same, they are different in practice. There are two main reasons for the difference. The first reason is an initial frequency error due to manufacturing tolerances of the oscillator. The second reason is a drift of the oscillator frequency over time. This happens due to various reasons such as temperature effects and aging. This cumulatively results in different oscillator frequencies between a WTRU and a base station.

The frequency difference of local oscillators between a WTRU and a base station causes system degradation. For example, in a Universal Terrestrial Radio Access/Time Division Duplex (UTRA/TDD) system, the frequency difference between a base station local oscillator and a WTRU local oscillator can be as large as +3 ppm. With a transmitter and receiver carrier frequency of about 2 GHz, 3 ppm corresponds to a frequency error of 6,000 Hz. Since the local oscillator is synthesized from the same local oscillator that is used for sampling, sampling at the receiver can drift as much as 1 chip every 8.7 frames for a TDD system.

SUMMARY

A method and apparatus for AFC of a local oscillator utilizes differences in successive phase estimates to maintain the frequency of the WTRU local oscillator within a desired or predetermined range relative to a base station local oscillator. A WTRU receives a carrier signal from a base station. The carrier signal includes a code sequence known to the WTRU. The WTRU downconverts the carrier signal into a baseband signal using the local oscillator. The WTRU performs a block correlation of the samples of the baseband signal with the known code sequence to generate a frequency error signal. The frequency error signal is fed back to the local oscillator to correct the frequency error.

BRIEF DESCRIPTION OF THE DRAWINGS

A more detailed understanding of the invention may be obtained from the following description of preferred embodiments, provided by way of example and to be understood in conjunction with the accompanying drawings in which.

DETAILED DESCRIPTION OF THE PREFERRED EMBODIMENTS

Figure 1:
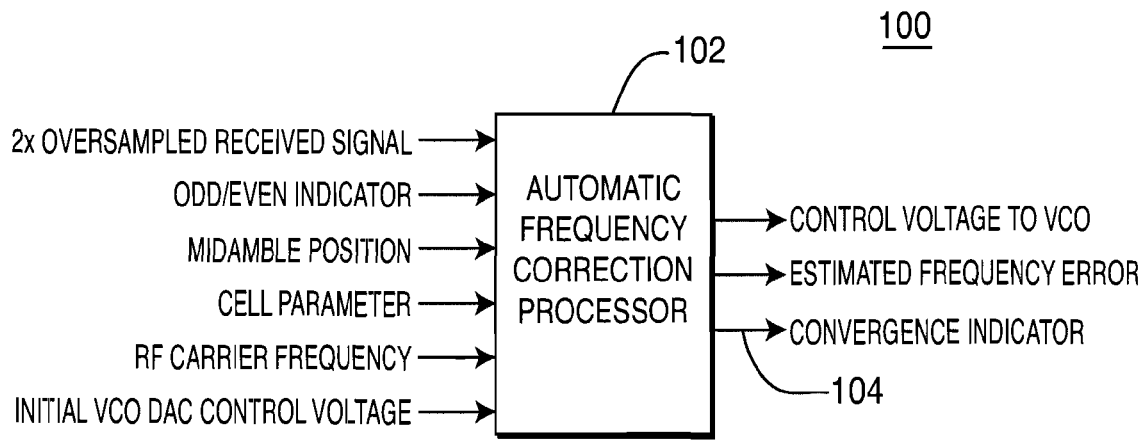
FIG. 1 is a block diagram of a process including inputs and outputs for an automatic frequency correction process operating in accordance with a preferred embodiment of the present invention.

The present invention will be described with reference to the drawing figures wherein like numerals represent like elements throughout.

The features of the present invention may be incorporated into an integrated circuit (IC) or be configured in a circuit comprising a multitude of interconnecting components.

Hereafter, the terminology "WTRU" includes, but is not limited to, a user equipment, a mobile station, a fixed or mobile subscriber unit, a pager, or any other type of device capable of operating in a wireless environment. When referred to hereafter, the terminology "base station" includes, but is not limited to, a Node-B, a site controller, an access point or any other type of interfacing device in a wireless environment.

Hereinafter, for simplicity, the present invention will be described with reference to a TDD system. However, it would be understood by a person skilled in the art that the teachings of the present invention are applicable to a general code division multiple access (CDMA) communication system, including frequency division duplex (FDD), time division synchronous CDMA (TDSCDMA), and CDMA 2000, or any other CDMA system.

FIG. 1 is a block diagram of a process 100 including inputs and outputs for an AFC processor 102 operating in accordance with a preferred embodiment of the present invention. The AFC processor 102 in accordance with the present invention utilizes several inputs, including a sampled received baseband signal, (preferably two times (2×) over-sampled), a location of a code sequence, (preferably in the form of a primary common control physical channel (P-CCPCH) midamble position), a cell parameter in the form of a basic midamble code number, an odd/even frame indicator, an RF carrier frequency, and an initial voltage controlled oscillator (VCO) digital-to-analog converter (DAC) control voltage. Optionally, the initial VCO DAC control voltage may be based upon a user defined value or a previously stored value. The outputs 104 of the AFC processor 102 include any of: (a) a control voltage for the VCO, (b) an estimated frequency error, and (c) an indicator of convergence.

The AFC is performed after completion of an initial cell search procedure. No channel estimation or equalization is required for the AFC to execute. The present invention will be explained hereinafter with reference to a midamble code in a P-CCPCH. However, it should be understood that any other pilot sequence can be used instead of P-CCPCH. The only required information for AFC is the location of a midamble of a P-CCPCH, which is provided after the initial cell search procedure. Initially, the AFC process uses the midamble of the P-CCPCH. Once a dedicated channel (DCH) is established, the AFC process may further use a midamble contained in the DCH.

Figure 2:
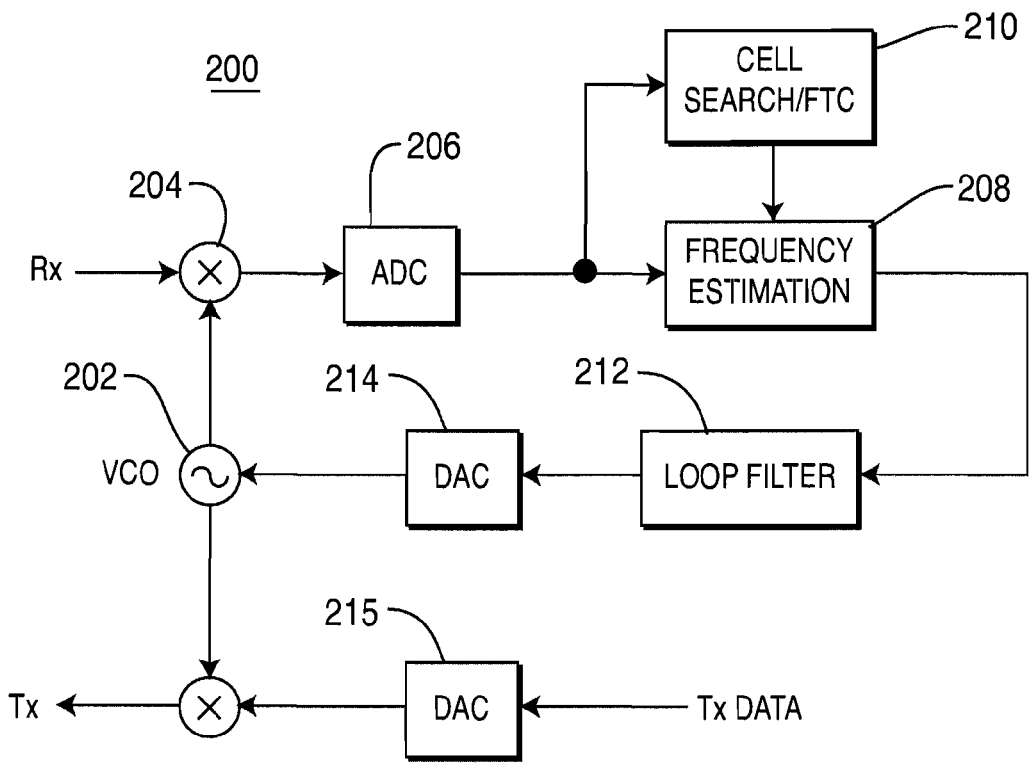
FIG. 2 is a block diagram of an apparatus for implementing automatic frequency correction in accordance with a preferred embodiment of the present invention.

FIG. 2 is a block diagram of an apparatus 200 for implementing AFC in accordance with a preferred embodiment of the present invention. The apparatus 200 comprises a VCO 202, a mixer 204, an analog-to-digital converter (ADC) 206, a frequency estimation block 208, a cell searching block 210, a loop filter 212, and a DAC 214. As shown in FIG. 2, the signal generated by the VCO 202 may also be used for a transmit process for mixing transmit data converted by a DAC 215, although this is not required.

A carrier signal includes a known code sequence, preferably a midamble code, and the known code sequence is used for estimating frequency error of the local oscillator. A received carrier signal is mixed by the mixer 204 with a signal generated by the VCO 202 to be converted to a baseband signal. The baseband signal is converted to a digital signal by the ADC 206. The ADC 206 over-samples the baseband signal, preferably at 2× the chip rate. The digital samples are input to the frequency estimation block 208 and the cell searching block 210.

The cell searching block 210 performs an initial cell searching procedure using any known method. After the cell searching procedure is performed, the cell searching block 210 outputs the location of a first significant path of the midamble code of a P-CCPCH. The 2× over-sampled received signal and the midamble position of the first significant path are input into the frequency estimation block 208. The frequency estimation block 208 generates a frequency error signal, which will be explained in detail hereinafter. The frequency error signal generated by the frequency estimation block 208 enters into the loop filter 212 that generates a correction signal for the VCO 202. This correction signal drives the measured frequency error to zero in a steady state. The correction signal may or may not be digital. If the correction signal is digital, it is converted to an analog signal by the DAC 214 before being applied to the VCO 202.

Figure 3:
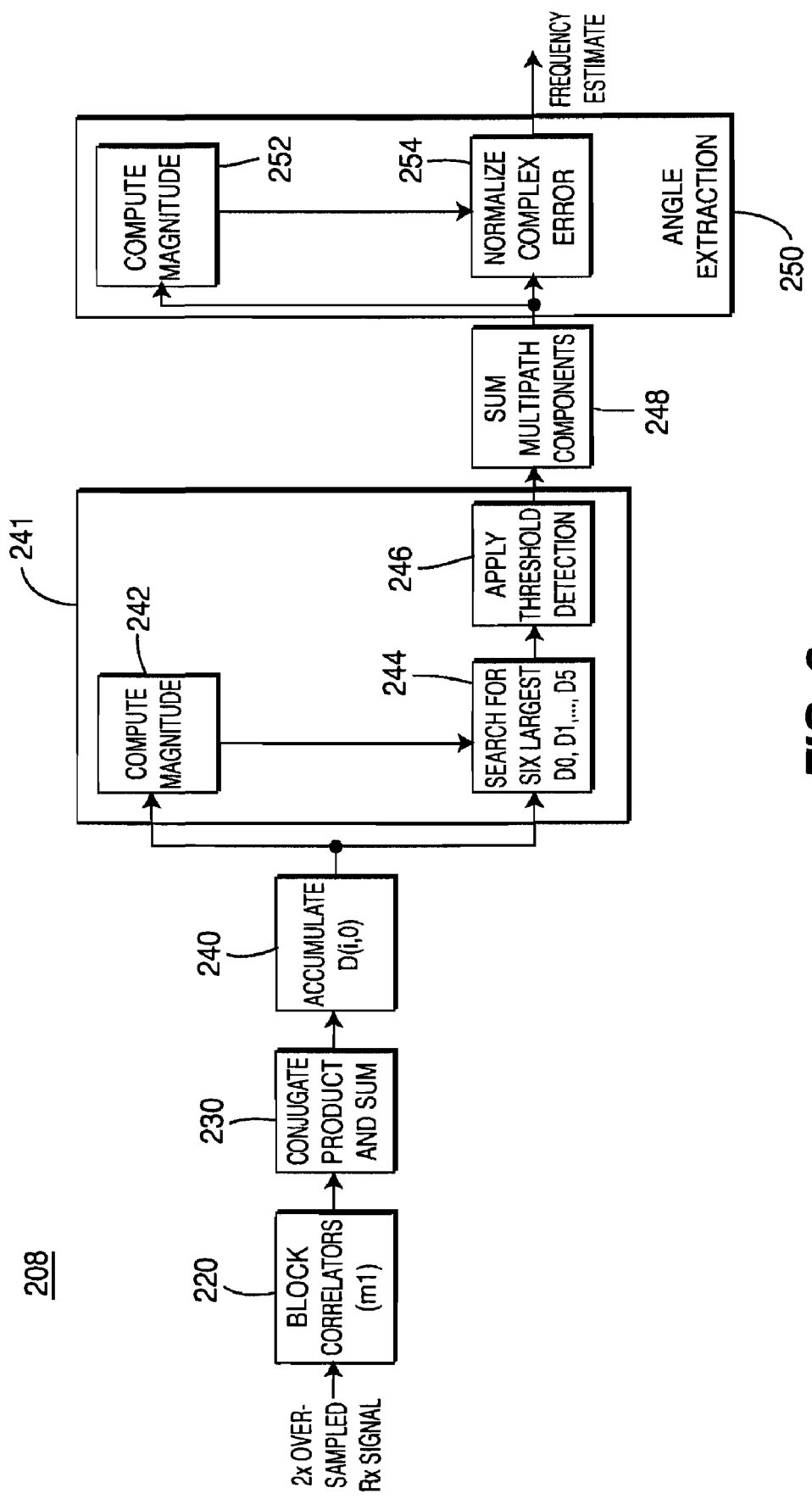
FIG. 3 is a block diagram of a frequency estimation block utilized in an apparatus of FIG. 2.

FIG. 3 is a block diagram of a frequency estimation block 208 utilized in the apparatus of FIG. 2. It should be understood that the configuration illustrated in FIG. 3 is provided only as an example, and any other types of architecture may be used in frequency estimation. Pursuant to a preferred embodiment of the present invention, the frequency estimation block 208 comprises at least one block correlator bank 220, at least one conjugate product and sum unit 230, and an angle calculation unit 250. The block correlator bank 220 performs correlation of the samples with the midamble to generate correlation results. The block correlator bank 220 comprises a plurality of block correlators as will be explained in detail hereinafter. The conjugate product and sum unit 230 receives the correlation results and generates an estimate of the phase change from one block correlator to the next block correlator in the block correlator bank 220. The angle calculation unit 250 generates a frequency estimate from the output of the conjugate product and sum unit 230. The frequency estimator 208 may further comprise an accumulator 240 for accumulating the output of the conjugate product and sum unit 230 over a predetermined time, a multipath detection unit 241 and a multipath combiner 248 for detecting and combining multipath components.

Figure 9:
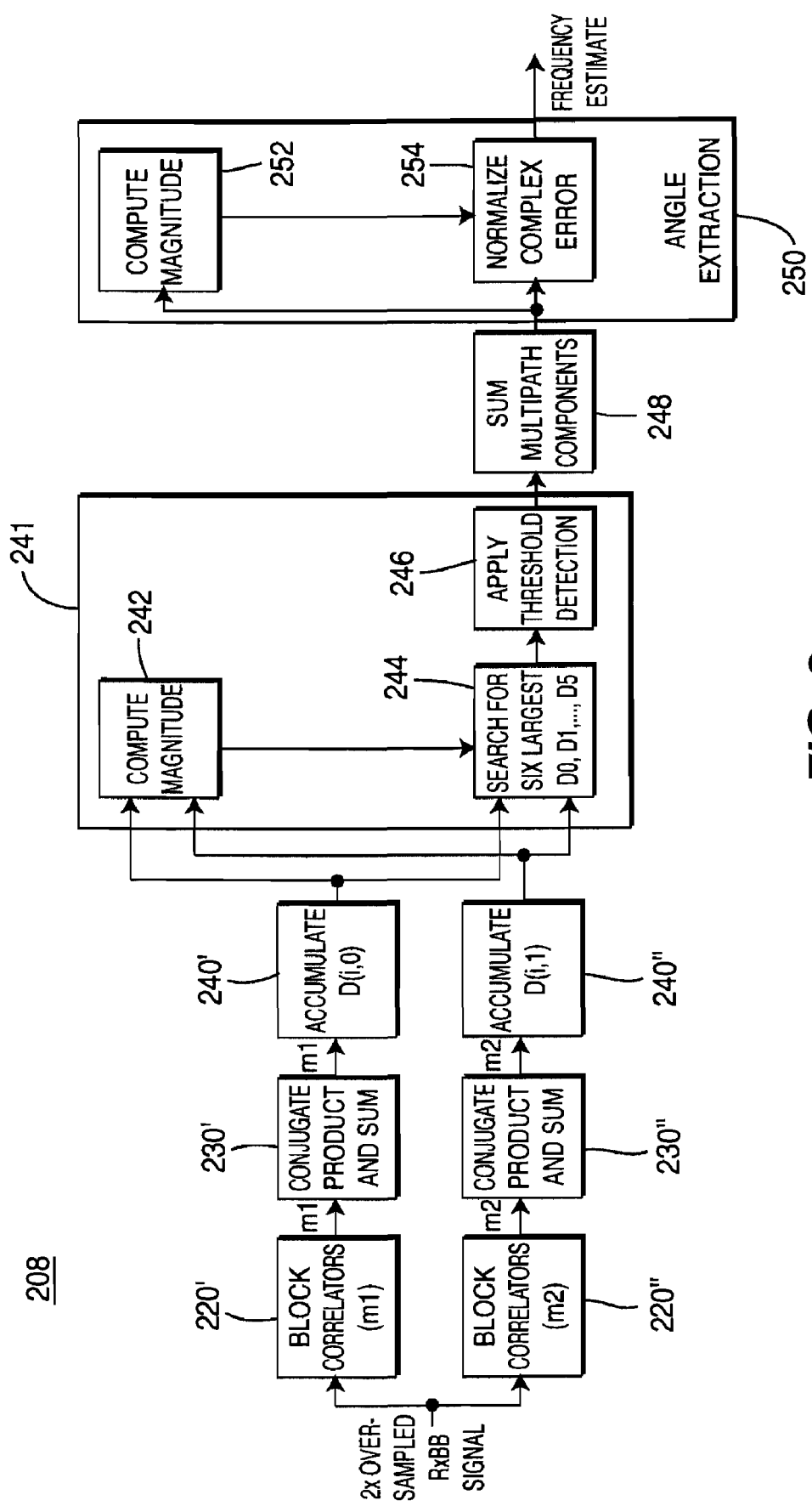
FIG. 9 is a block diagram of another embodiment of a frequency estimation block utilized in an apparatus of FIG. 2.

The frequency estimation block 208 may comprise more than one block correlator bank 220 and more than one conjugate product and sum unit 230 to process additional midambles. For example, as shown in FIG. 9, two midambles, $m_1$, and $m_2$ (j=0, 1) may be used. Thus, in this embodiment, the frequency estimation block 208 comprises two block correlator banks 220', 220" and two conjugate product and sum units 230', 230". A first block correlator bank 220' and conjugate product and sum unit 230' process the first midamble, $m_1$, and the second block correlator bank 220" and conjugate product and sum unit 230" process the second midamble, $m_2$. This allows for diversity gains when space code transmit diversity (SCTD) is employed.

Figure 4:
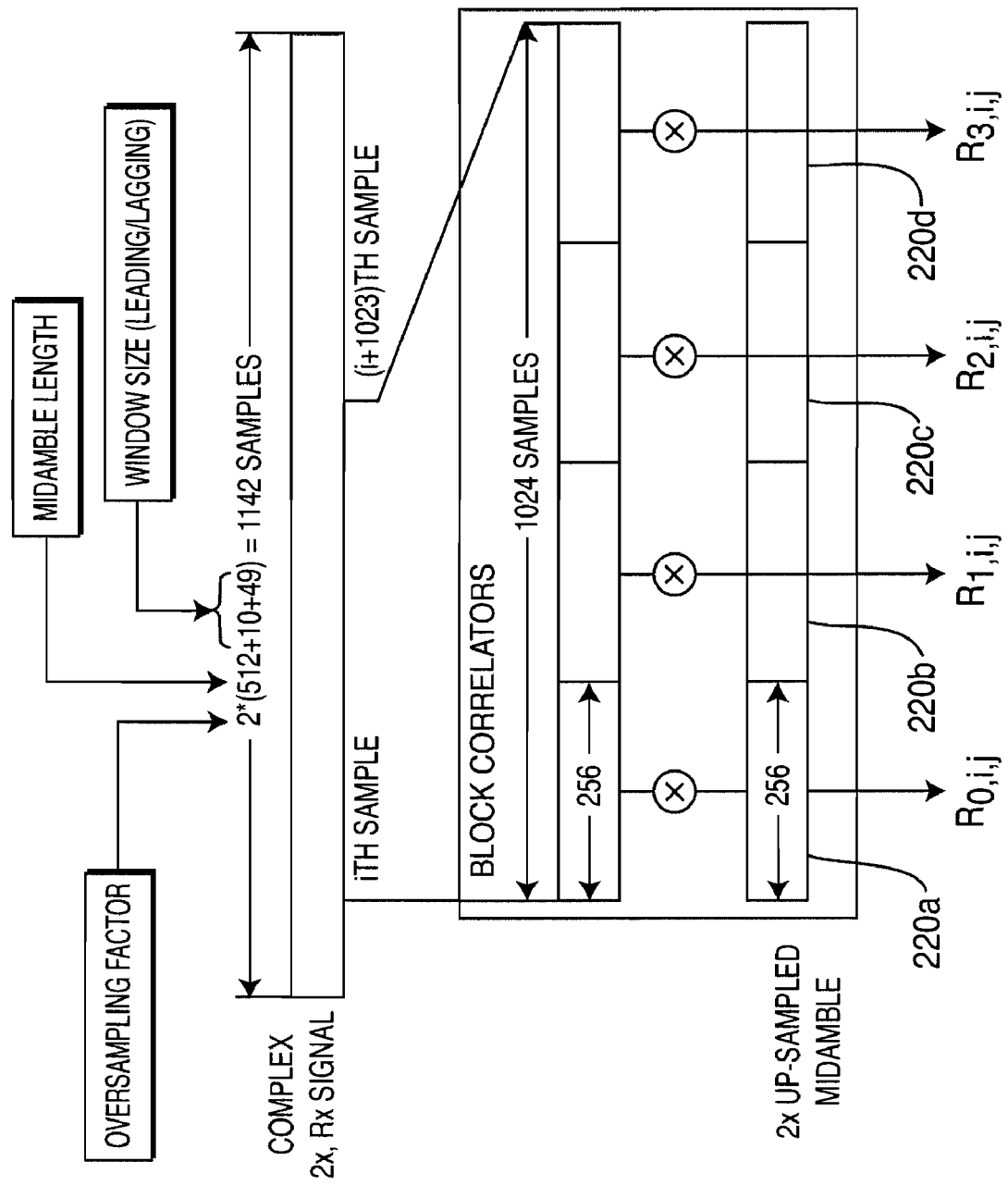
FIG. 4 is a diagram of block correlators utilized in the frequency estimation block of FIG. 3.

FIG. 4 is a block diagram of an example configuration of the block correlator bank 220 of FIG. 3 using sliding window block correlation. The block correlator bank 220 comprises a plurality of block correlators 220a-220d. Each block correlator 220a-220d performs correlation of the received baseband samples with the midamble to generate a correlation result. The size of the block, and hence number of blocks, is chosen to prevent excessive correlation loss before the AFC has corrected the initial error, but the specific size shown in the figure is not required.

As an example, if the AFC procedure processes a midamble of a P-CCPCH transmitted in a burst type 1, the transmission is 2× over-sampled, and the searching window includes 10 leading chips (20 samples), 49 lagging chips (98 samples), and 512 midamble chips (1024 samples), the total number of samples required for the sliding window is 1142 ($r_0$-$r_{1141}$). The leading samples provide margin for any undetected paths. The lagging samples provide margin for the maximum expected multipath spread. At each lag, four (4) correlations at each block correlator 220a-220d are performed. At each lag, 128 samples are input into each of four block correlators 220a-220d. For example, the first 128 even samples ($r_0$, $r_2$, ... $r_{254}$) are input to the first block correlator 220a, the next 128 even samples ($r_{256}$, $r_{258}$, ... $r_{510}$) are input to the second block correlator 220b, the next 128 even samples ($r_{512}$, $r_{514}$, ... $r_{766}$) are input to the third block correlator 220c, and the last 128 even samples ($r_{768}$, $r_{770}$, ... $r_{1022}$) are input to the fourth block correlator 220d. Each block correlator performs a correlation with a different portion of midamble code. In the foregoing example that 512 bits of midamble code and four (4) block correlators are used, each block correlator performs a correlation with 128 bits of midamble. The first block correlator 220a uses the first 128 bits of midamble, the second block correlator 220b uses the second 128 bits, the third and the fourth block correlators 220c, 220d use the third and the fourth 128 bits, respectively. Each block correlator 220a-220d generates a correlation result, $R_{0,i,j}$, $R_{1,i,j}$, $R_{2,i,j}$, and $R_{3,i,j}$, respectively.

Figure 5:
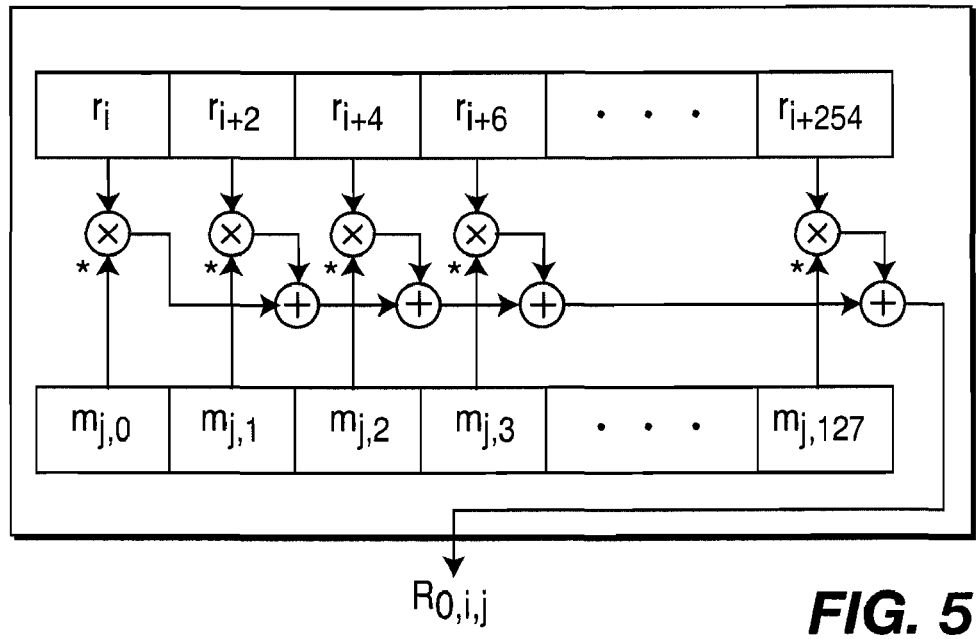
FIG. 5 is a block diagram of an exemplary first block correlation.

FIG. 5 is a block diagram of the first block correlator 220a in the block correlator bank 220. The first block correlator 220a receives 128 samples and performs a correlation of the samples with the first 128 bits of midamble, and produces $R_{0,i,j}$. In general, the output from the k'th block correlator at lag i is defined by:

$$R_{k,i,j} = \sum_{n=0}^{B-1} r_{i+2kB+2n} m^*_{j,kB+n}, \quad \text{Equation (1)}$$

where, for the foregoing example, $0 \leq i \leq 118$, $0 \leq k \leq 3$, $B=128$, and j, ($0 \leq j \leq 1$), corresponds to the midamble shift used for the correlation. The results of the sliding window correlation block ($R_{0,i,j}$, $R_{1,i,j}$, $R_{2,i,j}$, and $R_{3,i,j}$) are passed to the conjugate product and sum unit 230.

Figure 6:
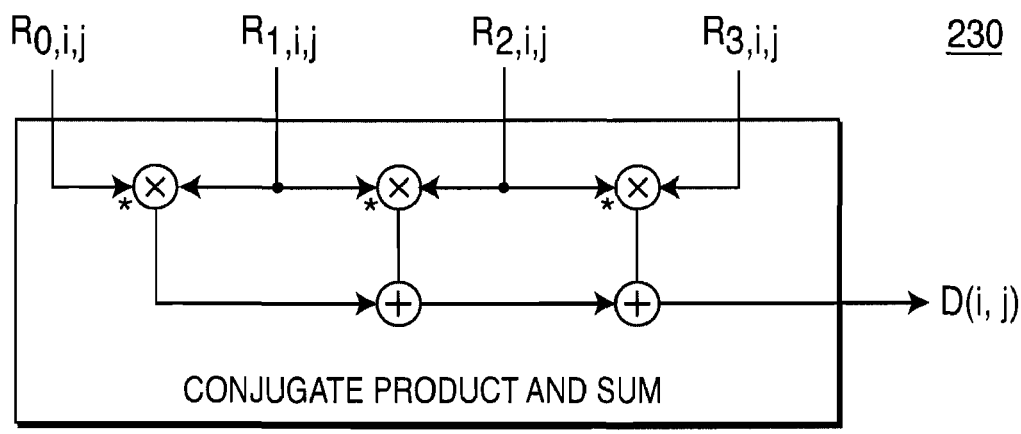
FIG. 6 is a block diagram of a conjugate product and sum unit utilized in the frequency estimation block of FIG. 3.

FIG. 6 is a block diagram of a conjugate product and sum unit 230 utilized in the frequency estimation block 208 of FIG. 3. The correlator output is a complex number that represents the centroid of the received samples with the midamble modulation removed. The conjugate product and sum unit 230 generates an estimate of the phase change from one block correlator to the next block correlator. This is accomplished by computing the conjugate product of successive correlator outputs. Conjugate of output $R_{0,i,j}^*$ from the first block correlator 220a is multiplied to an output $R_{1,i,j}$ of a second block correlator 220b, conjugate of output $R_{1,i,j}^*$ of the second block correlator 220b is multiplied to an output $R_{2,i,j}$ of a third block correlator 220c, and conjugate of output $R_{2,i,j}^*$ of the third block correlator 220c is multiplied to an output $R_{3,i,j}$ of a fourth block correlator 220d. Each output from a conjugate product operation is a complex vector with angle approximating the phase change from the center of one correlation to the next. The three conjugate products for each midamble, $m_1$ and $m_2$, are then summed together to produce a lower variance estimate of the phase change from one block correlator to the next. Conjugate products associated with $m_1$ are summed together and stored in D(i,0), and conjugate products associated with $m_2$ are summed together and stored in D(i,1). The equation defining the output of the conjugate product and sum block is:

$$D(i, j) = \sum_{k=1}^{3} R_{k,i,j} R^*_{k-1,i,j} \quad \text{Equation (2)}$$

The frequency estimation block 208 preferably comprises an accumulator 240. The accumulator 240 accumulates the output of the conjugate product and sum unit 230 over N midambles. The resulting accumulated complex numbers are defined as:

$$\overline{D}(i, j) = \sum_{N Midambles} D(j, i) \quad \text{Equation (3)}$$

The accumulation time, N, is initially set to 2 and is subsequently determined based on the most recent estimate of the absolute value of a frequency error. Table 1 provides exemplary values of N as a function of the frequency error. The values chosen for N guarantee that less than one quarter chip movement can occur between frequency updates, in order to prevent paths from crossing into adjacent samples.

TABLE 1

| Absolute frequency error (Hz) | Number of midambles (N) |
|---|---|
| (4000, ∞) | 2 |
| (2000, 4000) | 4 |
| (1000, 2000) | 6 |
| (100, 1000) | 12 |
| (0, 100) | 30 |

Referring back to FIG. 3, the frequency estimation block 208 may further comprise a multipath detection unit 241 and a multipath combiner 248. The multipath detection unit 241 comprises a magnitude calculation unit 242, a searching unit 244, and a threshold calculator 246. In order to combine multipath components, after N midambles have been processed through the sliding window block correlators 220, the multipath detection unit 241 searches to find several, (for example six (6)), accumulated value $\overline{D}(i,j)$ with the largest magnitudes. The accumulated values, $\overline{D}(i,j)$, are input to the magnitude calculation unit 242 and the searching unit 244. The magnitude calculation unit 242 calculates the magnitude of each accumulated value, $\overline{D}(i,j)$, and outputs the magnitude of each accumulated value, $\overline{D}(i,j)$, to the searching unit 244.

The searching unit 244 locates six (6) of the largest absolute values, (D0 (largest) through D5). The following equations precisely define the relationship between the accumulated values, $\overline{D}(i,j)$, and the six (6) resolved paths:

$$(i_0, j_0) = \underset{(i,j)}{\text{ArgMax}}(|\overline{D}(i, j)|); \quad \text{Equation (4)}$$

$$D0 = \overline{D}(i_0, j_0); \quad \text{Equation (5)}$$

$$(i_1, j_1) = \underset{(i,j) \neq (i_0, j_0)}{\text{ArgMax}}(|\overline{D}(i, j)|); \quad \text{Equation (6)}$$

$$D1 = \overline{D}(i_1, j_1); \quad \text{Equation (7)}$$

$$(i_n, j_n) = \underset{\substack{(i,j) \neq (i_0,j_0), \\ (i,j) \neq (i_1,j_1), \ldots, \\ (i,j) \neq (i_{n-1}, j_{n-1})}}{\text{ArgMax}}(|\overline{D}(i, j)|); \text{ and} \quad \text{Equation (8)}$$

$$Dn = \overline{D}(i_n, j_n); \quad \text{Equation (9)}$$

where $i_n$ and $j_n$ are the lag and midamble shift, respectively, associated with multi-path component Dn, and $0 \leq n \leq 5$. A total of six (6) paths are combined in the foregoing example, which corresponds to twice (for transmit diversity) the expected maximum number of significant multi-paths, which is three (3). It should be noted that other values may be used instead of six (6).

The threshold calculator 246 determines a detection threshold based on the magnitude of the peak (D0), and compares it to D1-D5. D1-D5 are considered significant if they are greater than $\beta|D0|$ in magnitude. Otherwise they are rejected as noise:

$$Dn' = \begin{cases} Dn, & |Dn| \geq \beta|D0| \\ 0, & \text{Otherwise} \end{cases} \quad \text{Equation (10)}$$

The detection threshold coefficient, $\beta$, is a configurable parameter.

If the magnitudes of D1-D5 exceed the detection threshold, they are deemed sufficiently large to be included in the frequency estimation computation. After D1-D5 are compared to the detection threshold, the multipath combiner 248 combines the surviving multipath components into a single complex vector whose angle is an estimate of the phase change of the carrier offset over one correlator block time period. This complex resultant is given by:

$$D = D0 + \sum_{n=1}^{5} Dn' \qquad \text{Equation (11)}$$

The angle calculation unit 250 determines a frequency estimate of the complex resultant. A trigonometric calculation can be employed in calculating the frequency estimate. However, the frequency estimate is preferably computed using two approximations. In order to extract the angle information from the multipath combiner 248 output, the complex vector is scaled to have unit magnitude and an approximation of the complex absolute value function is utilized in a magnitude calculation unit 252 and a complex error normalization unit 254. The complex absolute value approximation is as follows:

$$Abs_{approx}\{z\} = \text{Max}(|Re\{z\}|, |Im\{z\}|) + \tfrac{1}{2}\text{Min}(|Re\{z\}|, |Im\{z\}|) \qquad \text{Equation (12)}$$

It is necessary to make use of a small angle approximation for the angle of a complex unit vector. The approximation is as follows:

$$Im\{z\} \approx Arg(z) = \theta, \text{ if } \theta \ll 1, \text{ and } |z|=1. \qquad \text{Equation (13)}$$

Therefore, the equation that relates the estimated angle, $\theta$, with the complex output of the multipath combiner 248, D, is:

$$\theta = Im\left\{\frac{D}{Abs_{approx}\{D\}}\right\} \qquad \text{Equation (14)}$$

The definition of frequency is the rate of change of phase with respect to time. The time interval of the differential phase estimate is fixed at $BT_c$. Therefore estimated frequency error, $\epsilon$, is simply a scaled version of $\theta$:

$$\epsilon = \alpha\theta \qquad \text{Equation (15)}$$

Pursuant to a fixed-point implementation of AFC, the desired units of the estimated frequency error must be consistent with the VCO DAC register. As an example, where the VCO DAC has 10-bits of resolution and a dynamic range of ±7.275 ppm (≈29.1 kHz) which implies the LSB, $\delta$, represents a change of about 28 Hz. The constant $\alpha$ is provided by:

$$\alpha = \frac{1}{4\delta BT_c}; \qquad \text{Equation (16)}$$

where, $$\delta = f_c \cdot 7.275 \times 10^{-6}. \qquad \text{Equation (17)}$$

The LSB $\delta$, and therefore $\alpha$, are dependant upon the RF frequency to which the radio is tuned. It is, therefore, necessary for the AFC algorithm to be provided the RF carrier frequency in order to appropriately scale the estimated frequency error.

Figure 7:
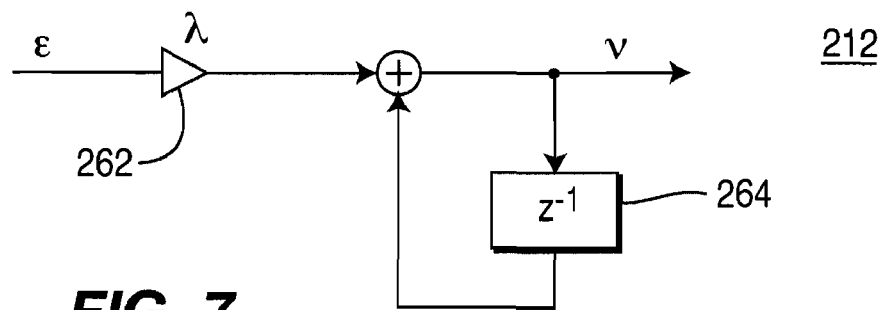
FIG. 7 is a block diagram of an integrator for integrating the estimated frequency error.

FIG. 7 is a block diagram of an illustrative integrator for integrating the estimated frequency error generated by the frequency estimator. The loop filter 212 takes the estimated frequency error $\epsilon$ as an input and the estimated frequency error is scaled by $\lambda$ 262 and performs an integration operation through a delay and feedback unit 264 in order to obtain the VCO DAC register, v:

$$v(t) = v(t-1) + \lambda e(t). \qquad \text{Equation (18)}$$

The integration is performed only when the error $\epsilon$ is dumped from the previous block. Therefore the value of v changes after N midambles are processed.

Upon initialization of AFC, the convergence indicator 104 is cleared. When an estimate of frequency error is smaller than a predetermined value, (for example 100 Hz in absolute value), the convergence indicator is set. If, after convergence, an estimated frequency error is computed that is larger than a predetermined value, for example 1 kHz in absolute value, the convergence indicator is cleared which indicates loss of frequency synchronization.

Figure 8:
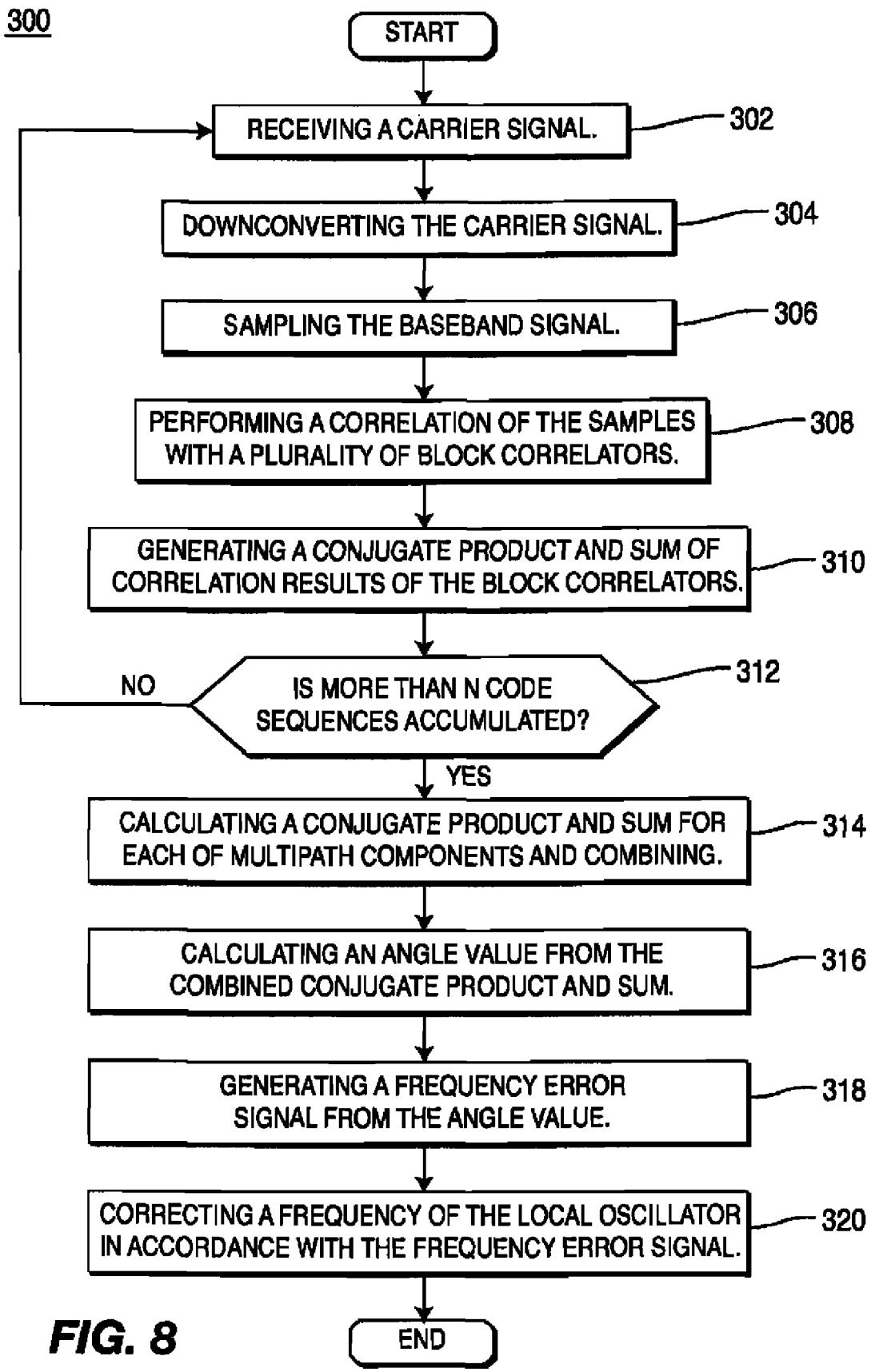
FIG. 8 is a flow diagram of a process for automatic frequency correction in accordance with the present invention.

FIG. 8 is a flow diagram of a process 300 for AFC in accordance with the present invention. A WTRU receives a carrier signal (step 302). The carrier signal includes a known code sequence, for example a midamble code. The WTRU downconverts the carrier signal into a baseband signal using a local oscillator (step 304). The WTRU performs sampling of the baseband signal preferable at 2X the chip rate (step 306). The samples are input into a plurality of block correlators to generate a plurality of correlation results (step 308). Correlation results of each block correlator are multiplied and summed in conjugate sense to generate a single conjugate product and sum (step 310). The conjugate product and sum are accumulated over N midambles. If N midambles are not accumulated, the process returns to step 302 to receive another carrier signal (step 312).

If it is determined that N midambles are accumulated at step 312, multipath components are detected and combined together (step 314). If it is determined that N midambles are not yet accumulated, the process 300 returns to step 302. In detecting the multipath components, several largest accumulated products are selected and compared to a detection threshold. The detection threshold may be set in accordance with the largest accumulated conjugate product and sum. An angle value, which is a frequency estimate, is calculated from the combined conjugate product and sum (step 316). In calculating the angle value, an approximation method may be utilized. A frequency error signal is generated from the angle value (step 318), and the frequency error signal is fed back to the local oscillator to correct the frequency error (step 320).

Although the features and elements of the present invention are described in the preferred embodiments in particular combinations, each feature or element can be used alone without the other features and elements of the preferred embodiments or in various combinations with or without other features and elements of the present invention.

What is claimed is:

1. A method for automatically correcting a frequency error of a local oscillator in a receiver, the method comprising:
    receiving a signal which includes a sequence known to the receiver;
    generating samples from the signal;
    correlating the samples and the sequence with a plurality of block correlators to generate a plurality of correlation values, each of the block correlators correlating a portion of the samples and a corresponding portion of the code sequence;
    generating a conjugate product and sum of the plurality of correlation values by multiplying correlation values generated by consecutive block correlators in a conjugate sense to generate a plurality of conjugate products and summing the conjugate products;

accumulating the conjugate product and sum over an accumulation time equal to N sequences, where N is a predetermined integer selected to ensure less than one quarter chip movement between frequency updates;

computing an angle value of the accumulated conjugate product and sum;

computing a frequency error estimate based on the angle value;

correcting a frequency error of the local oscillator using the frequency error estimate;

performing a plurality of correlations of the samples and the code sequence at each of a plurality of lags to generate a plurality of correlation values at each of the lags;

computing a plurality of conjugate product and sums of the correlation values at the lags;

combining the conjugate product and sums; and computing the angle value from the combined conjugate product and sums.

2. The method of claim 1 further comprising:

detecting multipath components, the conjugate product and sum being generated for each multipath component; and combining the conjugate product and sum for the multipath components, wherein the angle value is computed based on the combined conjugate product and sum.

3. The method of claim 2 wherein the multipath components are detected by comparing a magnitude of the conjugate product and sum to a threshold.

4. The method of claim 1 wherein the signal is sampled at twice the chip rate.

5. The method of claim 1 wherein the angle value is computed using a complex number magnitude approximation and complex number small angle approximation.

6. The method of claim 1 wherein the sequence is a midamble sequence.

7. The method of claim 6 wherein the midamble sequence is one of a primary common control physical channel midamble sequence and a dedicated channel (DCH) midamble sequence.

8. The method of claim 6 wherein two midamble sequences are simultaneous transmitted for transmit diversity, whereby the frequency error estimate is computed using the two midamble sequences.

9. A wireless transmit/receive unit (WTRU) which automatically corrects a frequency error of a local oscillator, the WTRU comprising:

a receiver including the local oscillator, the receiver being configured to receive a signal which includes a sequence known to the receiver;

a sampling unit configured to generate samples from the signal;

a plurality of block correlators configured to correlate the samples and the sequence to generate a plurality of correlation values, each of the block correlators being configured to correlate a portion of the samples and a corresponding portion of the code sequence;

a conjugate product and sum unit configured to generate a conjugate product and sum of the plurality of correlation values by multiplying correlation values generated by consecutive block correlators in a conjugate sense to generate a plurality of conjugate products and summing the conjugate products;

an accumulator configured to accumulate the conjugate product and sum over an accumulation time equal to N sequences, where N is a predetermined integer selected to ensure less than one quarter chip movement between frequency updates; and an angle extraction unit configured to compute an angle value of the conjugate product and sum and to compute a frequency error estimate based on the angle value, wherein a frequency error of the local oscillator is corrected using the frequency error estimate;

a threshold unit for comparing each of the selected conjugate product and sums with a threshold and removing a conjugate product and sum which is less than the threshold.

10. The WTRU of claim 9 further comprising:

a multipath detection unit configured to detect multipath components, the conjugate product and sum being generated for each multipath component, and to combine the conjugate product and sum for the multipath components, wherein the angle value is computed based on the combined conjugate product and sum.

11. The WTRU of claim 10 wherein the multipath components are detected by comparing a magnitude of the conjugate product and sum to a threshold.

12. The WTRU of claim 9 wherein the signal is sampled at twice the chip rate.

13. The WTRU of claim 9 wherein the angle value is computed using a complex number magnitude approximation and complex number small angle approximation.

14. The WTRU of claim 9 wherein the sequence is a midamble sequence.

15. The WTRU of claim 14 wherein the midamble sequence is one of a primary common control physical channel midamble sequence and a dedicated channel (DCH) midamble sequence.

* * * * *

UNITED STATES PATENT AND TRADEMARK OFFICE
CERTIFICATE OF CORRECTION

| | | |
|---|---|---|
| PATENT NO. | : 7,778,619 B2 | Page 1 of 1 |
| APPLICATION NO. | : 12/408285 | |
| DATED | : August 17, 2010 | |
| INVENTOR(S) | : Bultan et al. | |

It is certified that error appears in the above-identified patent and that said Letters Patent is hereby corrected as shown below:

ON THE TITLE PAGE

Item (56), U.S. PATENT DOCUMENTS, page 1, right column, after the line "6,728,326 B1 4/2004 Fulghum......375/365", insert therefor --6,728,882 4/2004 Gotoh et al.--.

IN THE CLAIMS

At claim 8, column 9, line 44 after the word "are", delete "simulteneous" and insert therefor --simultaneously--.

Signed and Sealed this
Nineteenth Day of April, 2011

David J. Kappos
*Director of the United States Patent and Trademark Office*